(12) United States Patent
Kobayashi

(10) Patent No.: US 7,652,423 B2
(45) Date of Patent: Jan. 26, 2010

(54) LIGHT-EMITTING DEVICE AND ELECTRONIC APPARATUS

(75) Inventor: Hidekazu Kobayashi, Toyoshina-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 12/487,426

(22) Filed: Jun. 18, 2009

(65) Prior Publication Data

US 2009/0267503 A1  Oct. 29, 2009

Related U.S. Application Data

(63) Continuation of application No. 11/094,453, filed on Mar. 31, 2005, now abandoned.

(30) Foreign Application Priority Data

Jul. 13, 2004  (JP)  ............................. 2004-205932
Jan. 26, 2005  (JP)  ............................. 2005-017914

(51) Int. Cl.
*H01L 51/50* (2006.01)
*H05B 33/24* (2006.01)
(52) U.S. Cl. ..................... 313/506; 313/504; 313/509
(58) Field of Classification Search .................. 313/504, 313/506, 509
See application file for complete search history.

(56) References Cited

U.S. PATENT DOCUMENTS

| 5,049,780 | A | 9/1991 | Dobrowolski et al. |
| 6,114,715 | A | 9/2000 | Hamada |
| 6,639,250 | B1 | 10/2003 | Shimoda et al. |
| 6,737,800 | B1 | 5/2004 | Winters et al. |
| 7,196,468 | B2 | 3/2007 | Fukuda |
| 7,242,140 | B2 | 7/2007 | Kobayashi et al. |
| 7,531,958 | B2 * | 5/2009 | Nishikawa et al. .......... 313/504 |
| 7,573,191 | B2 * | 8/2009 | Kobayashi ................. 313/503 |
| 2002/0190639 | A1 * | 12/2002 | Yamada et al. ............. 313/504 |
| 2004/0017335 | A1 | 1/2004 | Kobayashi et al. |
| 2005/0040756 | A1 | 2/2005 | Winters et al. |

FOREIGN PATENT DOCUMENTS

| JP | A-10-214043 | 8/1998 |
| JP | A-2004-127725 | 4/2004 |
| KR | 2004-15346 | 2/2004 |
| WO | WO 03/096758 A1 | 11/2003 |

* cited by examiner

*Primary Examiner*—Nimeshkumar D. Patel
*Assistant Examiner*—Anthony T Perry
(74) *Attorney, Agent, or Firm*—Oliff & Berridge, PLC

(57) ABSTRACT

A light-emitting device includes a transparent substrate, a light-emitting layer which is provided on one surface of the substrate and which emits light in response to an electrical signal, a conductive portion which transmits the electrical signal to the light-emitting layer, such that light from the light-emitting layer is emitted after being transmitted through the substrate, and a light transflective layer which is provided between the conductive portion and the substrate at a predetermined distance from the conductive portion to reflect some of incident light through the substrate and to transmit the remainder.

7 Claims, 10 Drawing Sheets

LIGHT-EMITTING DEVICE AND ELECTRONIC APPARATUS

This is a Continuation of application Ser. No. 11/094,453 filed Mar. 31, 2005. This application claims the benefit of Japanese Patent Application No. 2004-205932 filed Jul. 13, 2004 and Japanese Patent Application No. 2005-017914 filed Jan. 26, 2005. The entire disclosures of the prior applications are hereby incorporated by reference herein in their entirety.

BACKGROUND OF THE INVENTION

1. Technical Field

The invention relates to a light-emitting device such as an organic EL (electroluminescent) device or an inorganic EL device and to an electronic apparatus having the light-emitting device mounted therein.

2. Related Art

In a bottom emission-type organic EL device, a plurality of light-emitting elements (pixels) are arranged on one surface of a transparent substrate, such as a glass substrate, with an insulating film provided therebetween. Further, wiring lines are formed on regions between pixels. Light generated at each pixel is emitted after being transmitted through the substrate. The substrate may transmit light emitted from a light-emitting layer to an exterior and allow light from the exterior to be incident on the inside of the organic EL device. In the inside of the organic EL device, ratio of areas between the light-emitting portion and the remaining portion other than the light-emitting portion in each pixel is, for example, about 4:6, and most incident light which is transmitted through the substrate from the exterior is reflected by the wiring lines provided between the pixels. In addition, though not reflected by the wiring lines, light may be reflected by a common electrode serving as a cathode after being transmitted through the pixels. Therefore, when the organic EL device is driven to perform display, light emitted from the pixel and light reflected on the wiring line or the common electrode are mixed. As a result, the contrast may be deteriorated.

In order to prevent the contrast from deteriorating, according to a related art, there is provided a method in which an organic material for absorbing light between the wiring lines is arranged as a black matrix such that incident light does not reach the wiring line or the common electrode, or a method in which a circularly polarizing plate is arranged to overlap the display unit such that light reflected inside the device is prevented from leaking to the exterior. Japanese Unexamined Patent Application Publication 10-214043 is an example of the related art.

However, since the circularly polarizing plate is expensive, the cost of a light-emitting device using the circularly polarizing plate increases. Further, in the method disclosed in Japanese Unexamined Patent Application Publication No. 10-214043, it is necessary to pattern the black matrix so as to cover the regions between wiring lines and thus the manufacturing process is complex. Further, carbon is included in the black matrix and thus the wiring lines may become electrically connected to one another via the carbon.

SUMMARY

An advantage of the invention is that it provides a light-emitting device which is capable of suppressing light reflection at a wiring line or a cathode without complicating a manufacturing process to improve display contrast and to suppress manufacturing costs, and an electronic apparatus having the light-emitting device mounted therein.

According to a first aspect of the invention, there is provided a light-emitting device including a transparent substrate, a light-emitting layer which is provided on one surface of the substrate and which emits light in response to an electrical signal, a conductive portion which transmits the electrical signal to the light-emitting layer, such that light from the light-emitting layer is emitted after being transmitted through the substrate, and a light transflective layer which is provided between the conductive portion and the substrate at a predetermined distance from the conductive portion to reflect some of incident light through the substrate and to transmit the remainder.

In this case, some of incident light transmitted through the substrate is reflected by the light transflective layer and the remainder is reflected by the conductive portion after being transmitted through the light transflective layer and returns to the light transflective layer. Therefore, by setting a distance between the light transflective layer and the conductive portion to the predetermined distance, light reflected by the light transflective layer and light reflected by the conductive portion interfere with each other to cancel out. Accordingly, when the light-emitting device is driven, since light reflected from the conductive portion is not recognized, the contrast can be improved. In addition, since the light transflective layer may be formed on the portion on which the conductive portion is formed, it is not necessary to perform patterning to cover the regions between the wiring lines. Further, it is not necessary to use a circularly polarizing plate. Therefore, the light-emitting device can be manufactured at low cost without complicating a manufacturing process.

In addition, various transparent insulating members may be provided between the light transflective layer and the conductive portion. The materials may be freely selected. Further, when the member, such as the black matrix, for absorbing light is arranged, converted heat may be accumulated in the corresponding light absorbing member to have a bad influence on the light-emitting device. However, according to the invention, the light transflective layer is arranged, so that light interferes with each other to cancel out. Accordingly, heat is not accumulated and thus the light-emitting device can be stably driven. In particular, when the invention is applied to the organic EL device, it is possible to drive the light-emitting device without having the bad influence on the light-emitting layer.

In this case, it is preferable that 'the predetermined distance' be a distance that light reflected by the light transflective layer and light reflected by the conductive portion interfere with each other to cancel out, for example, a distance at which a zero-order interference occurs. However, in a case in which the light transflective layer and the conductive portion are arranged to be excessively adjacent to each other and it is difficult to interpose the insulating member therebetween, the determined distance may be a distance at which a first-order interference or a second-order interference occurs. In addition, since 'some' and 'the remainder' of incident light mean 'some' and 'the remainder' of the intensity or amount of incident light, not 'some' and 'the remainder' of wavelength components.

It is preferable that the light transflective layer have substantially the same pattern as that of the conductive portion. In this case, the pattern of the light transflective layer may be formed such that the shape thereof is equal to that of the conductive portion. As a result, when the conductive portion and the light transflective layer are manufactured, the same process may be repeated, and it is not necessary that a specific manufacturing process be performed. In addition, the light transflective layer may be formed larger than the conductive portion. As a result, for example, it is possible to transmit and reflect light from an oblique direction and thus it is possible to further improve the contrast.

In addition, it is preferable that the light-emitting device further include a transistor which is electrically connected to the conductive portion and the light-emitting layer. The conductive portion may correspond to at least one of a gate line and a source line of the transistor. Generally, in a TFT active matrix-type light-emitting device, the transistor is provided on each light-emitting layer and each transistor is provided with the gate line or source line of each of the wiring lines. As such, in the TFT active matrix-type light-emitting device in which the plural wiring lines are provided between the light-emitting layers, reflection by the wiring lines can be suppressed. Therefore, in this case, the invention is particularly significant.

It is preferable that the conductive portion be a common electrode of the light-emitting layer. According to this aspect of the invention, since light reflected by the common electrode after being transmitted through the light-emitting layer can cancel out, it is possible to further improve the contrast. In this case, it is preferable that the light transflective layer be formed at a predetermined distance from the common electrode serving as the cathode.

It is preferable that, when the predetermined distance is $d1$, a wavelength of incident light is $\lambda1$, a refractive index of a region between the conductive portion and the light transflective layer is $n1$, and an integer more than zero is $m1$, the light transflective layer is provided such that the distance $d1$ is represented by the following equation (1).

$$d1 = \lambda1(\tfrac{1}{2}+m1)/2n1 \tag{1}$$

According to this aspect of the invention, after the predetermined distance $d1$ is calculated using a so-called Bragg equation, the light transflective layer is arranged. Therefore, it is possible to increase precision of the interference.

In this case, it is preferable that the value of $\lambda1$ in the equation (1) be a value near a central wavelength of visible light. Light near the central wavelength of visible light is recognized by a person with high sensitivity. Since the reflection of light near the central wavelength of visible light can be suppressed, reflected light is reduced as compared to the case in which the reflection of light of another wavelength is suppressed. Therefore, it is possible to further improve the contrast.

In addition, preferably, a transmittance and a reflectance of the light transflective layer are set such that the intensity of light reflected by the light transflective layer and the intensity of light transmitted through the light transflective layer again after being transmitted through the light transflective layer and being reflected by the conductive portion are substantially equal to each other. As a result, light reflected by the light transflective layer and light reflected by the conductive portion substantially completely cancel out.

In addition, it is preferable that the light transflective layer be made of a metal. According to this aspect of the invention, since the light transflective layer is a portion which is required to generate the interference of light, preferably, physical characteristics such as the refractive index and the thickness of the layer are not changed. The metal, except for a liquid metal such as mercury, has a characteristic that it hardly transforms in a room temperature as compared to resin. Therefore, since the metal hardly transforms by heat generated when the light-emitting device is driven and the physical characteristics such as the refractive index and the thickness of the layer are not changed, it is possible to maintain the high contrast. It is preferable that the metal be a metal, such as aluminum, having high reflectivity. By forming the metal in a shape of a thin film, light can transmit the metal. In this case, in order to improve the quality of the film, copper or neodymium may be added to aluminum.

According to a second aspect of the invention, there is provided a light-emitting device including a transparent substrate, a light-emitting layer which is provided on one surface of the substrate and which emits light in response to an electrical signal, a conductive portion which transmits the electrical signal to the light-emitting layer, such that light from the light-emitting layer is emitted after being transmitted through the substrate, a light reflecting layer which is provided between the conductive portion and the substrate to reflect incident light from the substrate, and a light transflective layer which is provided between the light reflecting layer and the substrate at a predetermined distance from the light reflecting layer to reflect some of incident light through the substrate and to transmit the remainder.

In this case, since light transmitted through the light transflective layer is not reflected by the conducive portion and the light reflecting layer is additionally provided to reflect light, the light reflecting layer may be provided at any location without being restricted by the arrangement of the conductive portion. In addition, the light transflective layer and the light reflecting layer may be formed near the light-emitting layer as well as the region where the conductive portion is formed. In addition, since the material constituting the light reflecting layer may be selected regardless of the conductivity, a material having the superior reflectivity can be suitably selected.

In addition, it is preferable that the light transflective layer be provided to have substantially the same pattern as that of the light reflecting layer. In this case, the light transflective layer may be patterned such that the shape thereof is equal to that of the light reflection layer. As a result, when the light transflective layer and the light reflection layer are manufactured, the same process may be repeated, and it is not necessary that the specific manufacturing process be performed. In addition, the light transflective layer may be formed larger than the light reflection layer. Therefore, it is possible to transmit and reflect light from the oblique direction and thus it is possible to further improve the contrast.

In addition, it is preferable that, when the predetermined distance is $d2$, a wavelength of incident light is $\lambda2$, a refractive index of a region between the light reflecting layer and the light transflective layer is $n2$, and an integer more than zero is $m2$, the light reflecting layer and the light transflective layer are provided such that the distance $d2$ is represented by the following equation (2).

$$d2 = \lambda2(\tfrac{1}{2}+m2)/2n2 \tag{2}$$

In the invention, after calculating the predetermined distance $d2$ using the so-called Bragg equation, the light reflecting layer and the light transflective layer are arranged. Therefore, it is possible to increase precision of the interference.

In this case, it is preferable that the value of $\lambda2$ in the equation (2) be a value near a central wavelength of visible light. Since the reflection of light near the central wavelength having high spectral luminous efficiency is suppressed, reflected light is reduced as compared to the case in which the reflection of light of another wavelength is suppressed. Therefore, it is possible to further improve the contrast.

In addition, it is preferable that a transmittance and a reflectance of the light transflective layer be set such that the intensity of light reflected by the light transflective layer and the intensity of light transmitted through the light transflective layer again after being transmitted through the light transflective layer and being reflected by the light reflecting layer are substantially equal to each other. As a result, light reflected by the light transflective layer and light reflected by the light reflection layer substantially completely cancel out.

In addition, it is preferable that the light transflective layer be made of a metal. Since the metal hardly transforms by heat generated when the light-emitting device is driven and the physical characteristics such as the refractive index and the thickness of the layer are not changed, it is possible to maintain the high contrast.

According to a third aspect of the invention, there is provided an electronic apparatus having the above-described light-emitting device. As a result, it is possible to obtain an electronic apparatus having the high contrast at low manufacturing cost.

BRIEF DESCRIPTION OF THE DRAWINGS

The invention will be described with reference to the accompanying drawings, wherein like numbers reference like elements, and wherein.

DESCRIPTION OF THE EMBODIMENTS

First Embodiment

A first embodiment of the invention will now be described with reference to the accompanying drawings. In the accompanying drawings, the scales of respective elements are suitably changed so that the elements can be clearly recognized.

Figure 1:
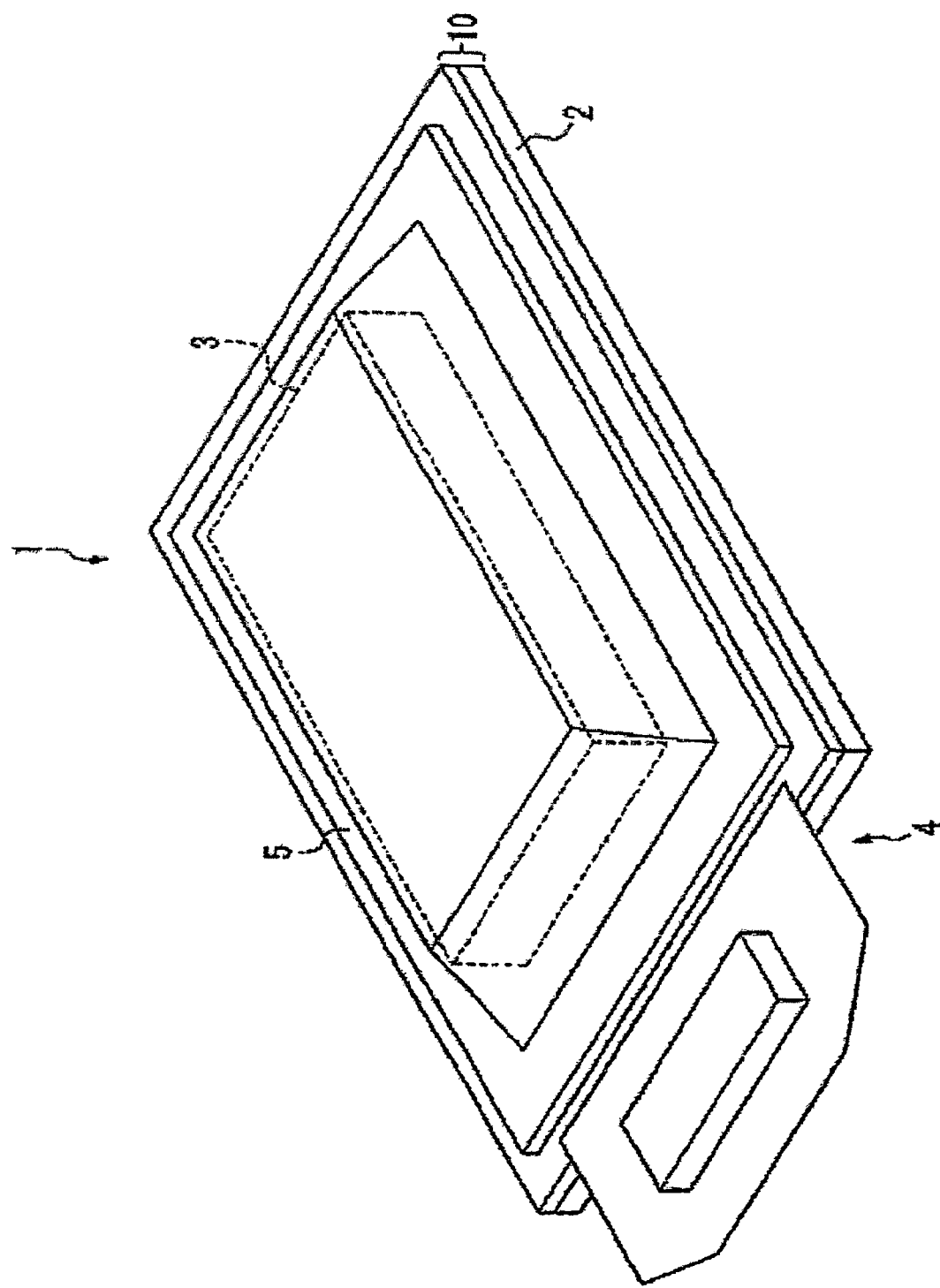
FIG. 1 is a perspective view showing the overall configuration of an organic EL device according to a first embodiment of the invention.

FIG. 1 is a perspective view schematically showing the overall configuration of an organic EL device 1.

The organic EL device 1 includes a base substrate 10 having circuit elements or wiring lines, an insulating layer, and the like formed on a substrate 2, an organic EL element 3 formed on the base substrate 10, and an external circuit unit 4 attached to an end of the base substrate 10. The organic EL element 3 emits light according to an electrical signal which is supplied from the external circuit unit 4, such that an image or a moving picture is displayed. In addition, a sealing member 5 is provided to cover the organic EL element 3 and the base substrate 10. The organic EL device 1 exemplified in the present embodiment is an active matrix type on which thin film transistors (TFTs) are formed and is a bottom emission type in which light generated by the organic EL element 3 is emitted with having passing through the base substrate 10.

Figure 2:
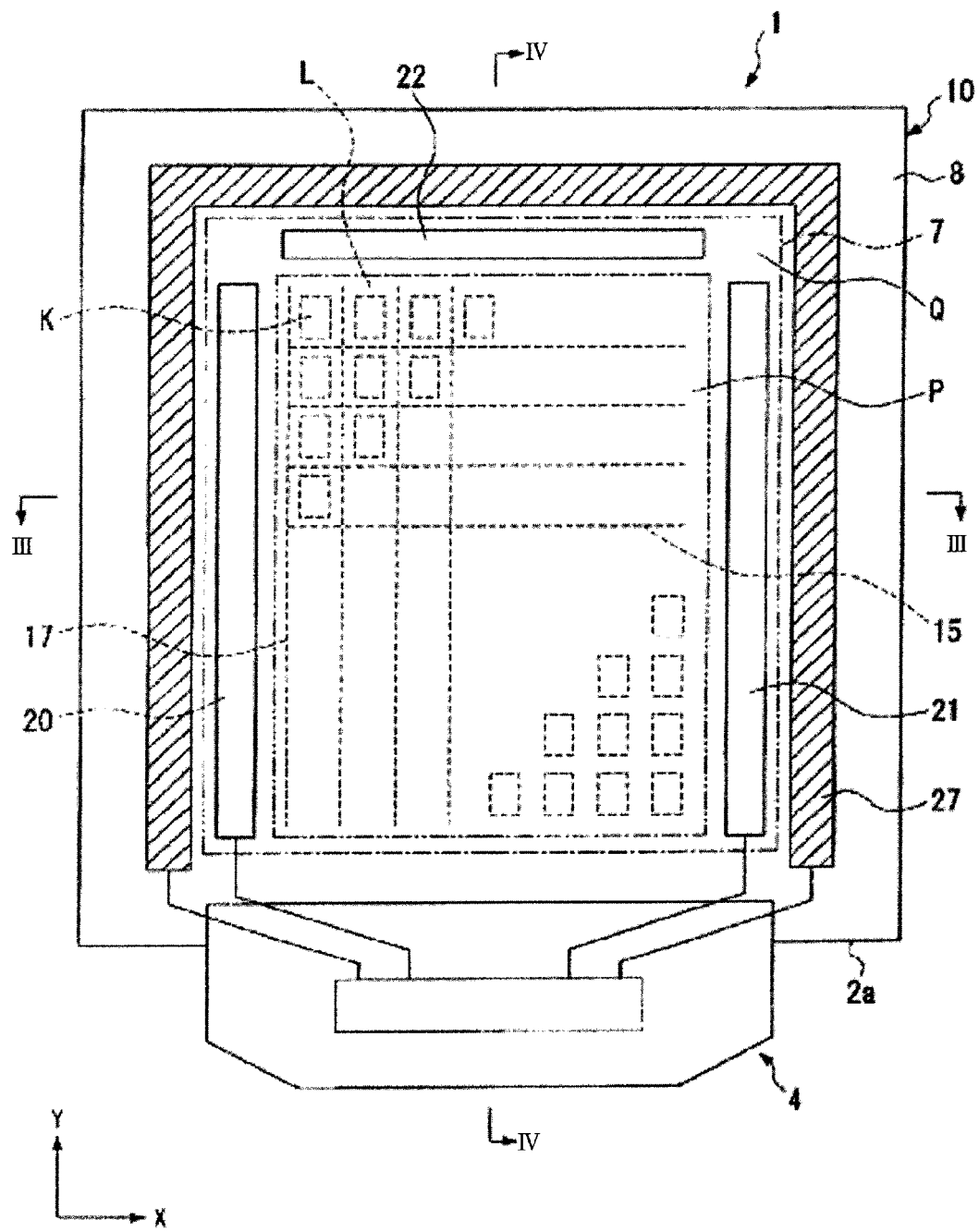
FIG. 2 is a plan view of the organic EL device.
Figure 3:
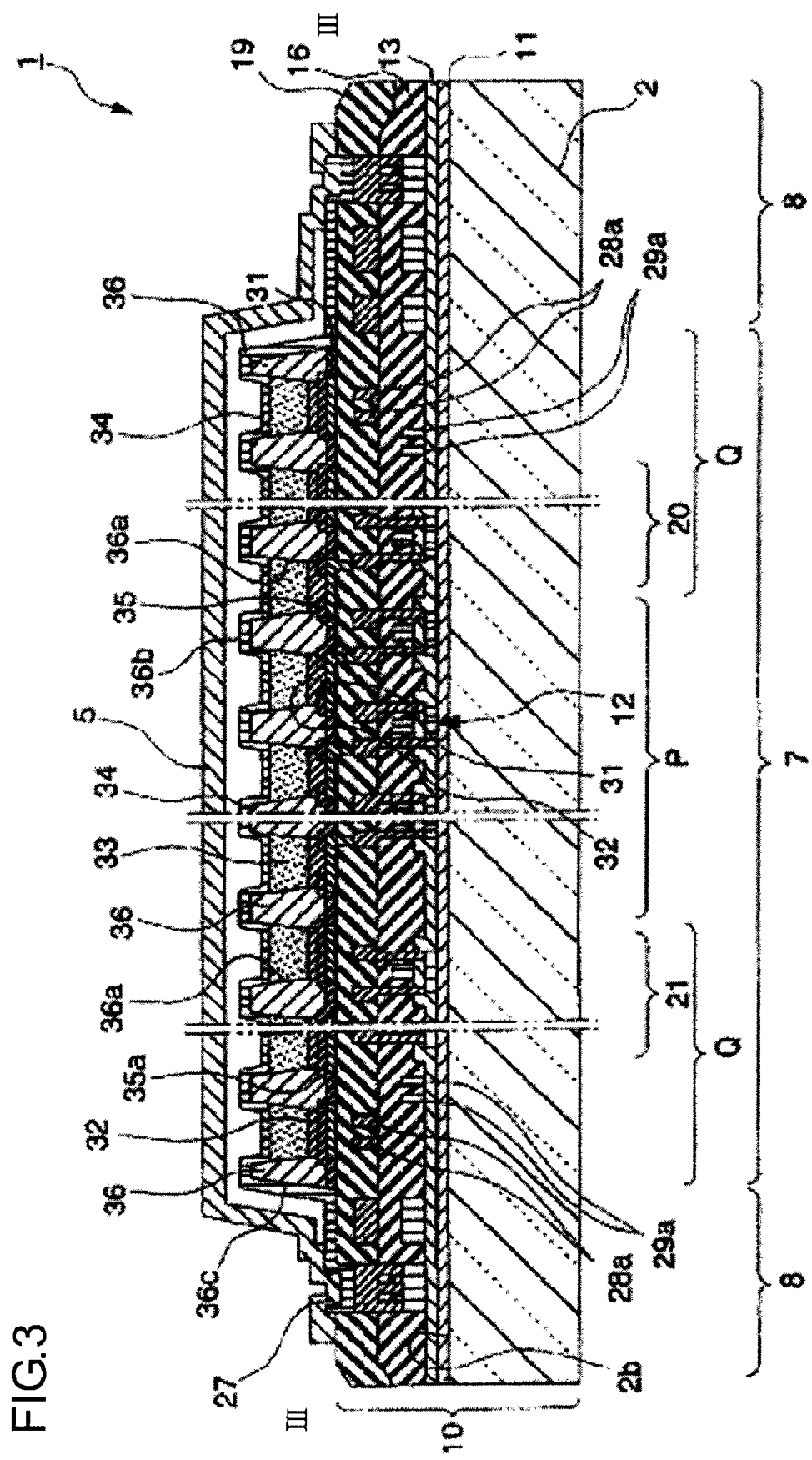
FIG. 3 is a cross-sectional view showing the configuration of the organic EL device taken along the line III-III of FIG. 2.
Figure 4:
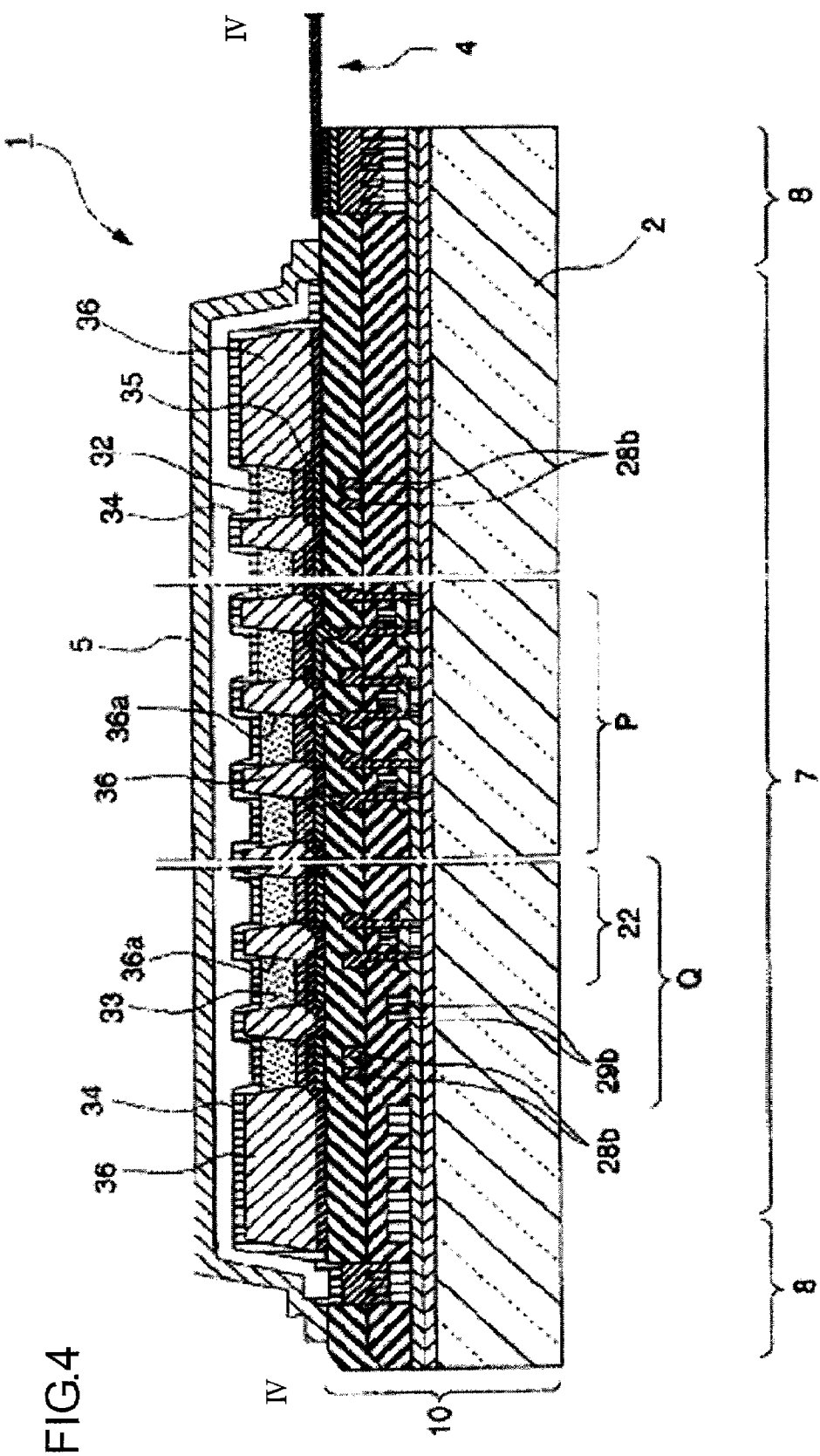
FIG. 4 is a cross-sectional view showing the configuration of the organic EL device taken along the line IV-IV of FIG. 2.
Figure 5:
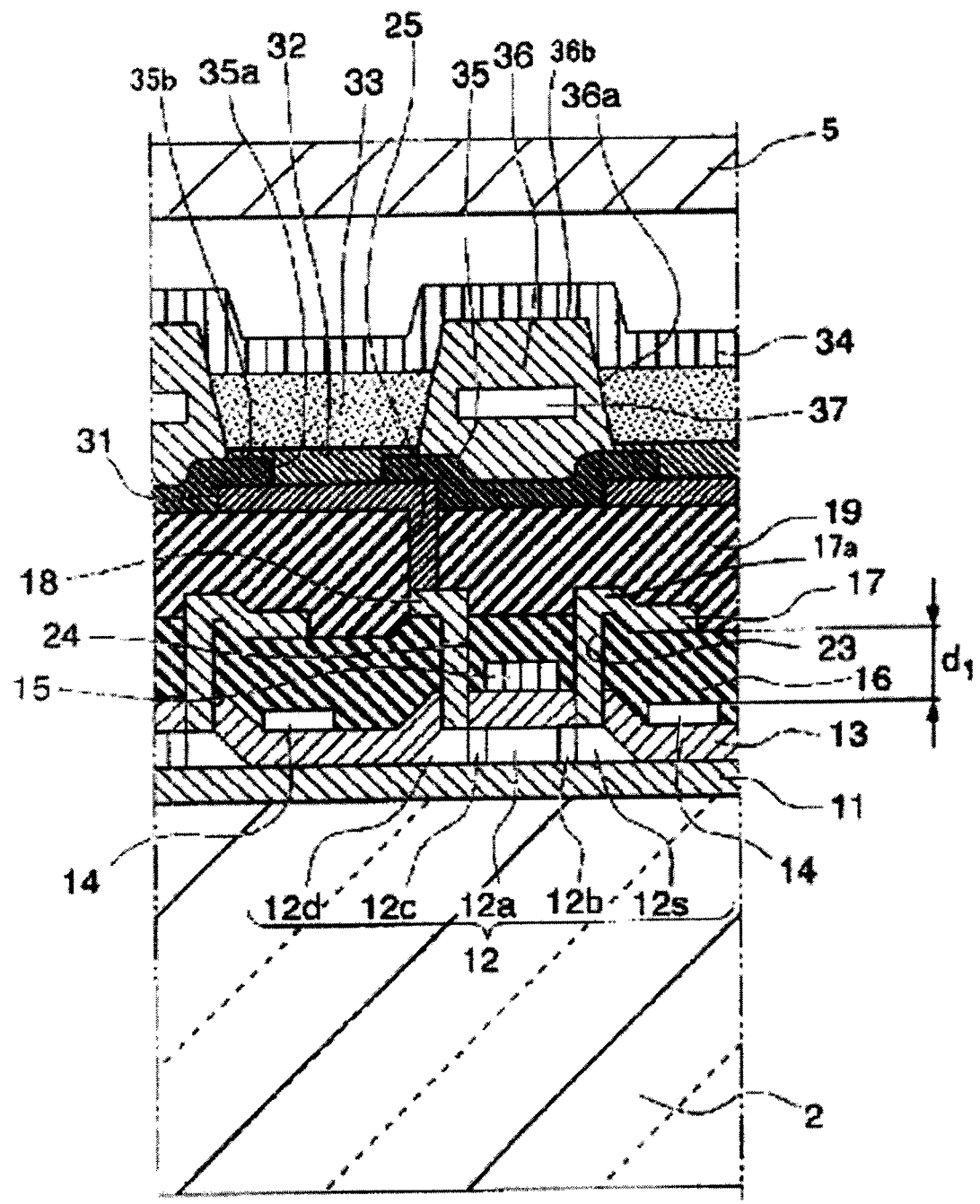
FIG. 5 is an expanded cross-sectional view of a portion of FIG. 4.

FIG. 2 is a plan view of the organic EL device 1 shown in FIG. 1. In FIG. 2, the organic EL element 3 and the sealing member 5 are omitted. FIG. 3 is a cross-sectional view of the organic EL device 1 taken along the line III-III of FIG. 2. FIG. 4 is a cross-sectional view of the organic EL device 1 taken along the line IV-IV of FIG. 2. FIG. 5 is an expanded cross-sectional view of an actual display region P of the organic EL device 1.

As shown in FIG. 2, the base substrate 10 is divided into a pixel portion 7 (a region within a one-dot-chain line) and a peripheral portion 8 (a region outside the one-dot-chain line). The pixel portion 7 is also divided into an actual display region P (a region within a two-dot-chain line) and a dummy region Q (a region between the one-dot-chain line and the two-dot-chain line). In addition, the actual display region P of the pixel portion 7 is divided into pixel regions K through which light from the organic EL element 3 is transmitted and regions L between pixels in which electrodes or wiring lines are arranged.

The organic EL device 1 will be described with reference to FIGS. 3, 4, and 5. The substrate 2 serving as the element of the base substrate 10 is a transparent substrate made of, for example, glass, quartz, or resin (a plastic sheet or a plastic film). Since the organic EL device 1 according to the present embodiment is a bottom-emission-type device, the substrate 2 needs to be transparent to emit light. In addition, there is a case that, by making the substrate 2 transparent, incident light from the exterior is transmitted through the substrate 2 to reach the inside of the device. A transparent base protective layer 11, made of $SiO_2$, serving as a base is formed on a surface 2b of the substrate 2.

As shown in FIG. 5, on the base protective layer 11 arranged in the actual display region P of the pixel portion 7, a silicon film 12, a first insulating layer (gate insulating layer) 13, a half mirror 14, a gate wiring line 15, a second insulating layer 16, a source wiring line 17, a drain electrode 18, and a third insulating layer 19 are formed. Specifically, they are provided on the regions L between the pixels. In addition, as shown in FIGS. 3 and 4, on the base protective layer 11 arranged on the dummy region Q of the pixel portion 7, a scanning line driving circuit 20, a data line driving circuit 21, a test circuit 22, and the like are formed. In addition, a power supply line (not shown) connected to the external circuit unit 4 is also formed.

The silicon film 12 forms a driving transistor having a channel region, a source region, and a drain region. A portion of the silicon film 12 overlapping the gate wiring line 15 with the gate insulating layer 13 interposed therebetween serves as the channel region 12a. A lightly doped source region 12b and a heavily doped source region 12s are formed near the source of the channel region 12a and a lightly doped drain region 12c and a heavily doped drain region 12d are formed near the drain of the channel region 12a. As such, the driving thin film transistor has an LDD (Light Doped Drain) structure.

In the heavily doped source region 12s and the heavily doped drain region 12d, contact holes 23 and 24 which are provided to continuously pass through the gate insulating layer 13 and the second insulating layer 16 are formed. In addition, in the heavily doped drain region 12d, a contact hole 25 which passes through the third insulating layer 19 so as to be connected to a pixel electrode (anode 31) is formed.

The gate insulating layer 13 is a transparent layer made of $SiO_2$ or SiN and electrically isolates the silicon film 12 and the gate wiring line 15 from each other.

As shown in FIG. 2, the gate wiring lines 15 and the source wiring lines 17 are arranged in a matrix shape. The gate wiring lines 15 are formed so as to extend in an X direction of FIG. 2 and are made of aluminum or copper. Further, the source wiring lines 17 are formed so as to extend in a Y direction of FIG. 2 approximately orthogonal to the gate wiring lines 15. The source wiring line 17 is connected to the heavily doped source region 12s via the contact hole 23 and a source electrode 17a. In addition, a drain electrode 18 is connected to the heavily doped drain region 12d.

The second insulating layer 16 is a transparent layer mainly made of $SiO_2$ and electrically isolates the gate wiring line 15, the source wiring line 17, and the drain electrode 18 from one another.

On the gate insulating layer 13, the half mirror 14 having the same shape as that of the source wiring line 17 is formed. The half mirror 14 is made of a metal such as aluminum and is formed to have a thin film shape. The half mirror 14 reflects some of the light transmitted through the substrate 2, the base protective layer 11, and the gate insulating layer 13 toward the substrate 2 and transmits the remainder. In order to improve the quality of the film, for example, copper or neodymium may be added to the aluminum.

In addition, when the wavelength of incident light from the exterior is λ1, the refractive index of a region (in the present embodiment, the second insulating layer 16) between the source wiring line 17 and the half mirror 14 is n1, and m1 is an integer more than zero, it is preferable that the half mirror 14 is provided at a distance d1 represented by the following equation from the source wiring line 17:

$$d1=\lambda1(\tfrac{1}{2}+m1)/2n1$$

According to this configuration, light reflected by the half mirror 14 after being transmitted through the substrate 2 and light reflected by the source wiring line 17 after being transmitted through the half mirror 14 as it is interfere with each other and cancel out.

In addition, since light near a central wavelength of visible light is recognized with high sensitivity by humans, if the reflection of light near the central wavelength is suppressed, reflected light can be further reduced as compared to the case in which the reflection of light of another wavelength is suppressed. Therefore, it is further preferable that the half mirror 14 be provided at the distance d1 calculated when λ1 is set as the central wavelength of visible light, for example, 520 nm. According to the present embodiment, since the refractive index of the second insulating layer 16 ($SiO_2$) is 1.46, the zero-order interference (m1=0) is generated at the distance d1=89 nm. Therefore, the half mirror 14 is provided at the distance of 89 nm from the source wiring line 17.

In order to provide the half mirror 14 at the predetermined distance as described above, the thickness of the second insulating layer 16 interposed between the source wiring line 17 and the half mirror 14 may be suitably adjusted. When the distance is calculated as d1=89 nm, by setting the thickness of the second insulating layer 16 to 89 nm, the half mirror 14 can be arranged at the predetermined distance.

In addition, by adjusting the thickness of the half mirror 14 (that is, the adjustment of the reflectance and transmittance), the intensity of light reflected by the half mirror 14 and the intensity of light transmitted through the half mirror 14 can be changed. For example, when the thickness of the half mirror 14 is small, the intensity of light transmitted through the half mirror 14 is weak and the intensity of light reflected by the half mirror 14 is strong. Therefore, the half mirror 14 is preferably formed to have a thickness (for example, 10 nm) such that the intensity of light reflected by the half mirror 14 after being transmitted through the substrate 2 and the intensity of light being transmitted through the half mirror 14 again after being transmitted through the half mirror 14 as it is and being reflected at the source wiring line 17 are equal to each other. In addition, it is preferable that the half mirror 14 be formed at a distance that the phase of light is inverted. As such, light reflected at the source wiring line 17 after being transmitted through the half mirror 14 and light reflected by the half mirror 14 substantially completely interfere with each other to cancel out.

In addition, n1 is the refractive index of the second insulating layer 16. However, when the half mirror 14 is provided within the gate insulating layer 13, since the gate insulating layer 13 and the second insulating layer 16 are included in the region between the half mirror 14 and the source wiring line 17, d1 is calculated based on the refractive indexes of the gate insulating layer 13 and the second insulating layer 16. In addition, as described above, the pattern may be formed such that the half mirror 14 has the same shape as that of the source wiring line 17. In addition, by forming the half mirror 14 so as to be wider than the source wiring line 17, light from an oblique direction may be transmitted or reflected.

The third insulating layer 19 is made of acrylic resin and electrically isolates the source wiring line 17, the drain electrode 18, and the contact hole 25 from one another. In addition, the third insulating layer 19 may be made of a material other than an acrylic insulating film, such as, for example, SiN and $SiO_2$.

In addition, the scanning line driving circuit 20 provided on the dummy region Q has a memory such as a shift register or a circuit such as a level shifter for converting a signal level and is connected to the gate wiring line 15. The data line driving circuit 21 has a video line or a circuit such as an analog shifter, in addition to a shift resister and a level shifter, and is connected to the source wiring line 17. The scanning line driving circuit 20 and the data line driving circuit 21 are connected to the external circuit unit 4 through driving control signal lines 28a and 28b (see FIGS. 3 and 4) and output electrical signals to the gate wiring line 15 and the source wiring line 17 under the control of the external circuit unit 4. The test circuit 22 is a circuit to test the operation status of the organic EL device 1 and has a test information output unit (not shown) for outputting a test result to the exterior. The test circuit 22 tests the quality and defects of the display device during manufacturing or at the time of shipment. In addition, the scanning line driving circuit 20, the data line driving circuit 21, and the test circuit 22 are connected to a power supply via driving power supply lines 29a and 29b.

The peripheral portion 8 is provided with a connecting wiring line 27 connected to the organic EL element 3. The connecting wiring line 27 is connected to the external circuit unit 4 and the electrical signals are supplied from the external circuit unit 4 to the organic EL element 3 through the connecting wiring line 27.

On the other hand, the organic EL element 3 has an anode 31, a hole injection layer 32, a light-emitting layer 33, a common electrode (cathode) 34, a pixel opening film 35, and an organic bank layer 36, which are deposited on the base substrate 10. The anode 31, the hole injection layer 32, and the light-emitting layer 33 are formed on the pixel region K, and the pixel opening film 35 and the organic bank layer 36 are mainly formed on the regions L between pixels.

The anode 31 is a transparent electrode for injecting holes into the hole injecting layer 32 and is made of ITO (Indium Tin Oxide) or the like. The anode 31 is connected to the drain electrode 18 through the contact hole 25.

The hole injection layer 32 is a layer for carrying the holes injected from the anode 31 to the light-emitting layer 33 and is made of polythiophene derivatives, polypyrrole derivatives, or polythiophene derivative or polypyrrole derivative-doped bodies. In addition, the cathode 34 is a layer for injecting electrons into the light-emitting layer 33 according to the electrical signal supplied from the external circuit unit 4 and is made of a metal such as calcium. The cathode 34 is larger than the actual display region P and the dummy region Q and is formed so as to cover the respective regions and the outside of the organic EL element 3. The cathode 34 is connected to the connecting wiring line 27 and is connected to the external circuit unit 4 via the corresponding connecting wiring line 27. In addition, in order to prevent the cathode 34 from corroding in manufacturing, a protective layer made of aluminum or the like may be formed on the cathode 34.

The light-emitting layer 33 is made of a known light-emitting material, such as a low-molecular-weight material or a high-molecular-weight material, which can emit fluorescent light or phosphorescent light. In the light-emitting layer 33, the holes from the hole injection layer 32 and the electrons from the cathode 34 are combined with each other and light is emitted. In the light-emitting layer 33, there are three layers including a layer for emitting a red light component (33R), a layer for emitting a green light component (33G), and a layer for emitting a blue light component (33B). The light components emitted from the light-emitting layers 33R, 33G, and 33B are transmitted through the anode 31, the hole injection layer 32, and the base substrate 10, so that an image or moving picture is displayed on the actual display region P of the substrate 2.

The pixel opening film 35 is an insulating film for dividing the pixel region K. The pixel opening film 35 allows the holes to travel from the anode 31 in the opening portion 35a and prevents the holes from traveling to a region other than the opening portion 35a.

The organic bank layer 36 is a partition wall when the hole injection layer 32 or the light-emitting layer 33 is formed by a liquid drop ejection method using an inkjet device and is an insulating layer to prevent the holes from traveling between the hole injection layer 32 and light emitting layer 33 adjacent to each other. The organic bank layer 36 is made of acryl or polyimide. In addition, since light entering the device after being transmitted through the substrate 2 may reach the cathode 34 and be reflected by the cathode 34, a half mirror 37 is provided in the organic bank layer 36 at the predetermined distance d1 from the cathode 34. Similarly to the above-described half mirror 14, the half mirror 37 is configured to reflect some of the incident light through the substrate 2 and to transmit the remainder.

Figure 6:
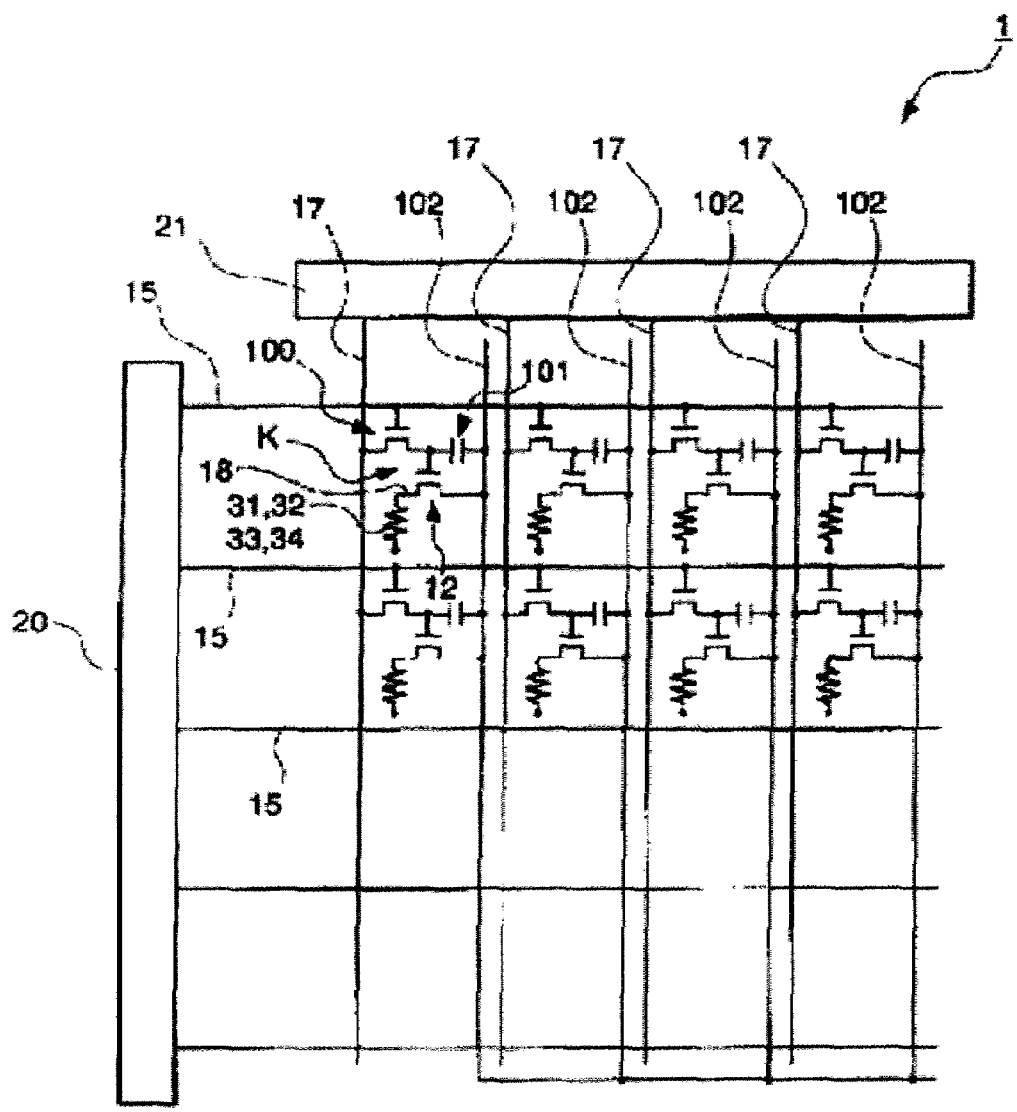
FIG. 6 is a schematic view conceptually showing an equivalent circuit of the organic EL device.

FIG. 6 is a schematic view conceptually showing a wiring structure of the organic EL device 1 configured in such a manner.

According to the organic EL device 1, when a gate signal is turned to a high level voltage through the gate wiring line 15, the switching TFT 100 is turned on. If so, an electric potential of the source wiring line 17 is stored in a storage capacitor 101 and an ON current value of the driving TFT 12 is determined according to the state of the electric potential of the storage capacitor 101. The driving TFT 12 makes the current flow from a power supply line 102 to the anode 31 according to the state. The anode 31 supplies the holes to the light-emitting layer 33 through the hole injection layer 32 and the electrons travel from the cathode 34 to the light-emitting layer 33. In such a manner, the current flows into the cathode 34 from the anode 31, so that the light-emitting layer 33 emits light according to the amount of current. In addition, the storage capacitor 101 may be formed by using the above-mentioned half mirror 14.

Next, a manufacturing process of the organic EL device 1 according to the present embodiment will be briefly described. In addition, in the present embodiment, the process for forming the base substrate 10 and the region of the pixel portion 7 of the organic EL element 3 will be described and the process for forming the peripheral portion 8 will be omitted.

First, according to the above-mentioned method, the base protective layer 11 is formed on the substrate 2, and the silicon film 12 is formed thereon. Then, the silicon film 12 is turned into polysilicon by a laser annealing method. After the silicon film 12 is covered with the gate insulating layer 13, the gate wiring line 15 is formed.

Next, the half mirror 14 is formed on the gate insulating film 13 through patterning to have the same pattern as that of the source wiring line 17. On the half mirror 14, the second insulating layer 16 is formed to have a thickness determined such that the distance between the half mirror 14 and the source wiring line 17 becomes the above-described distance d1.

Next, the source electrode 17a connected to the source area 12s of the silicon film 12 through the contact hole 23 and the drain electrode 18 connected to the drain area 12d of the silicon film 12 through the contact hole 24, are formed. Then, the source wiring line 17 is patterned on the second insulating layer 16 to overlap the half mirror 14 with the same pattern as that of the half mirror 14. Next, the third insulating layer 19 is formed so as to cover the source wiring line 17, the drain electrode 18 is formed, and the contact hole 25 is formed at the drain side through etching. In addition, the contact hole 25 is formed in the pixel region K for the connection with the anode 31. In such a manner, a driving circuit portion is formed.

Next, a process for forming the organic EL element 3 will be described.

A transparent conductive film for the anode 31 is formed on the third insulating layer 19 to cover the entire surface of the base substrate 10. The conductive film is patterned to form the anode 31 on the pixel region K. At this time, a dummy pattern (not shown) of the dummy region is simultaneously formed. Through the present process, the anode 31 and the drain electrode 18 are connected to each other through the contact hole 25 in the pixel region K.

Next, on an exposure portion of the third insulating layer 19, the pixel opening film 35 as the insulating layer is formed so as to overlap the anode 31 a little.

On the pixel opening film 35, the organic bank layer 36 is formed with a material obtained by dissolving resist such as acrylic resin, polyimide resin, or the like into a solvent by various coating methods such as a spin coating method, a deep coating method, or the like. As for the organic bank layer 36, the bank forming process may be divided into two steps and the half mirror 37 may be formed during the bank forming process.

Next, by heating the entire surface of the organic bank layer 36 at a temperature of 70 to 80° C., the organic bank layer 36 is subjected to an $O_2$ plasma treatment. The plasma treatment uses oxygen as a reactive gas atmosphere and makes a wall surface 35a and a top surface 35b of the pixel opening film 35 and a surface of the anode 31 have a lyophilic property. In addition, under the atmosphere, a $CF_4$ plasma treatment with tetrafluoromethane as a reactive gas makes the top surface 36b and the wall surface 36a of the organic bank layer 36 have lyophobic. Subsequently, the respective layers are cooled down to room temperate.

Next, the hole injection layer 32 is injected by a liquid drop ejection method such as the inkjet method or a spin coating method. Subsequently, a drying treatment or heat treatment is formed such that the hole injection layer 32 is formed on the anode 31. The injected liquid droplets are spread on the anode 31 subjected to the lyophilic treatment and are filled into the opening portion 35a. The liquid droplets are not attached to the top surface 36b and opening portion 36a and the top surface 36b of the organic bank layer 36 subjected to the liquid-repellent treatment. In addition, in processes subsequent to the present process, in order to prevent the oxidization of the hole injection layer 32 and the light-emitting layer 33, it is preferable that the processes are performed under an inert gas atmosphere such as a nitrogen atmosphere or an argon atmosphere.

After the hole injection layer 32 is dried and annealed, the light-emitting layer forming materials are ejected onto the hole injection layer 32 by the inkjet method and subjected to drying treatment and heat treatment, so that the light-emitting layer 33 is formed. In the present process, for example, a material for the light-emitting layer 33B is selectively coated onto a blue display region and is subjected to the drying treatment. Then, similarly, materials for the light-emitting layers 33G and 33R are selectively coated onto a green display region and a red display region respectively and are subjected to the drying treatment. In addition, if necessary, the electron injection layer may be formed on the light-emitting layer 33.

After the drying treatment and the annealing treatment, a calcium film is formed using a physical vapor deposition method such as a deposition method to form the cathode 34. The cathode 34 covers the light-emitting layer 33, the top surface 36b of the organic bank layer 36, and the wall surface 36c that forms an outside of the organic bank layer 36 (FIG. 3) and is connected to the connecting wiring line 27.

In addition, when a cathode protective layer is formed on the cathode 34, for example, an aluminum film is formed on the cathode 34 by a physical phase deposition method such as the deposition method. Almost all the base substrate 10 including the driving circuit portion and the organic EL element 3 formed in such a manner is sealed by the sealing member 5, to complete the organic EL device 1.

Next, the present embodiment will be compared to the related art with reference to FIGS. 7A and 7B and FIGS. 8A and 8B. In the drawings, only essential elements are shown and the detailed configurations will be omitted.

Figure 7A:
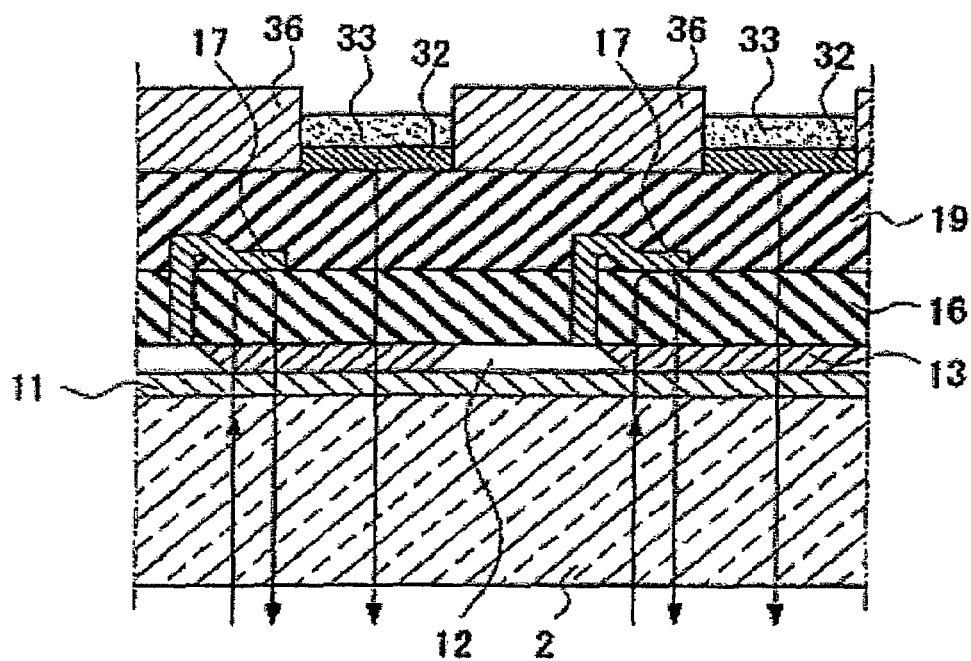
FIG. 7A is a diagram illustrating an organic EL device in which a half mirror is not provided.
Figure 7B:
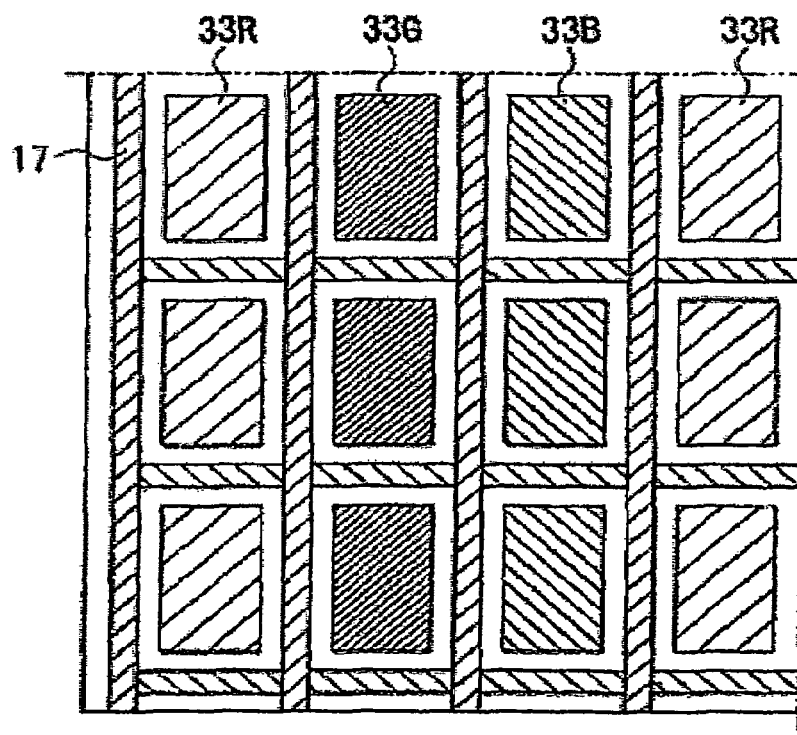
FIG. 7B is a plan view showing a display screen.
Figure 8A:
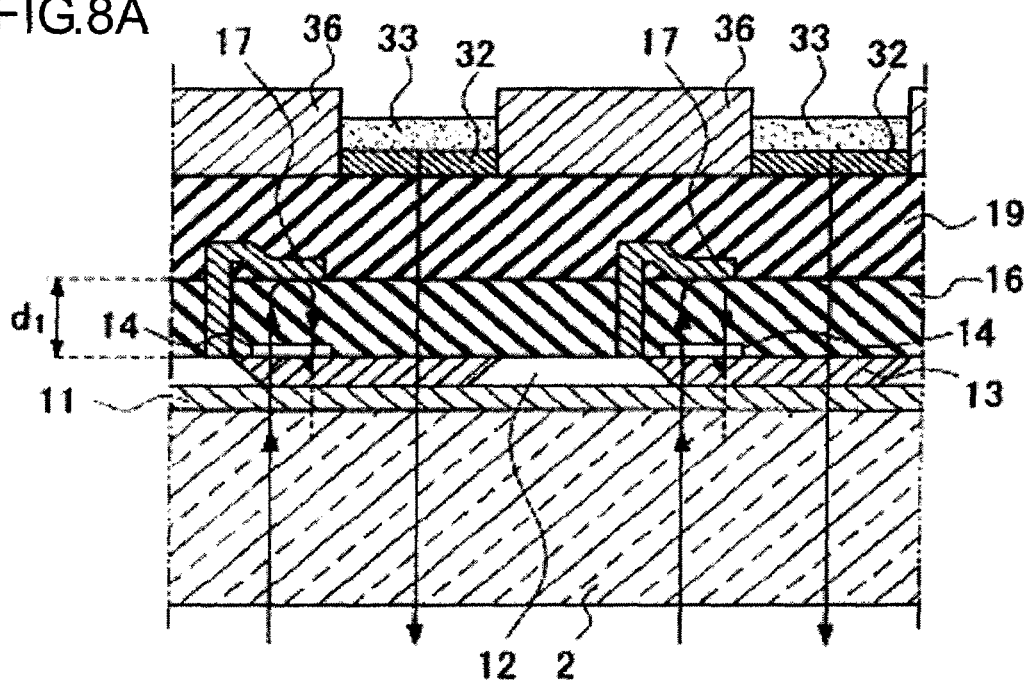
FIG. 8A is a diagram illustrating an organic EL device in which the half mirror is provided.
Figure 8B:
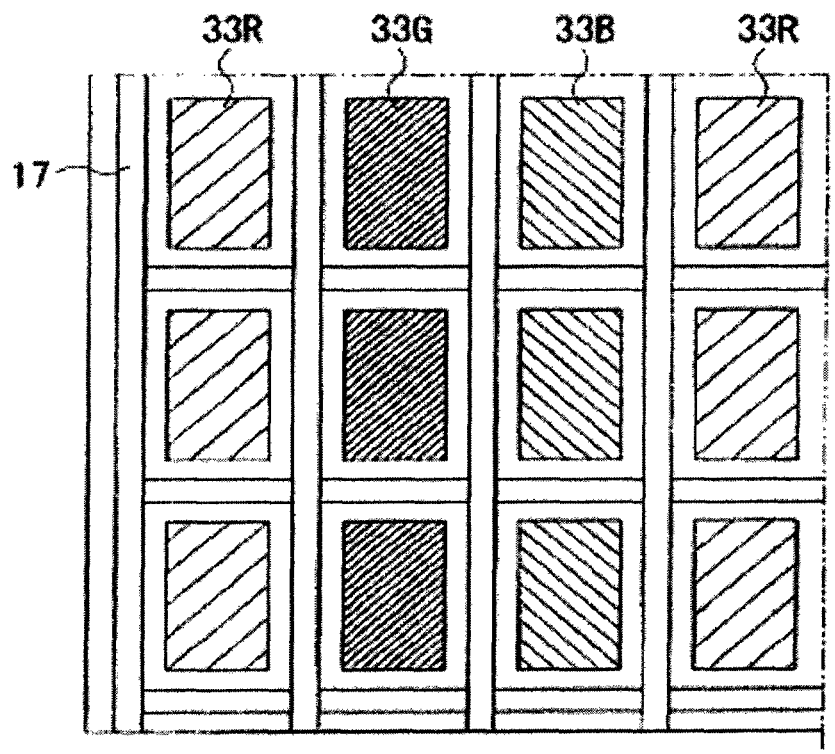
FIG. 8B is a plan view showing a display screen.

FIG. 7A shows the case in which the half mirrors 14 and 37 are not provided. In this case, since incident light through the substrate 2 is reflected by the source wiring line 17 or the cathode 34 to be emitted together with light emitted from the light-emitting layer 33, the display contrast is drastically deteriorated. This status is represented by hatched lines on the source wiring lines 17 provided between the pixels. On the other hand, in the case of the present embodiment shown in FIG. 8, since the half mirrors 14 and 37 are provided, some of light transmitted through the substrate 2 is reflected by the half mirrors 14 and 37 and the remainder is reflected by the source wiring line 17 or the cathode 34 after being transmitted through the half mirrors 14 and 37. At this time, the distance between the half mirror 14 and the source wiring line 17 and the distance between the half mirror 37 and the cathode 34 are set to the above-mentioned predetermined distances d1 and d2, respectively, so that light reflected by the half mirror 14 or 37 and light reflected by the source wiring line 17 or the cathode 34 interfere with each other to cancel out. Therefore, when the organic EL device 1 is driven, reflected light of the actual display region P is suppressed, so that it is possible to improve the contrast. According to the present embodiment, since the half mirror 14 or 37 may be provided at the portion where the source wiring line 17 or the cathode 34 is provided, it is not necessary to cover the black matrix between the wiring lines such as the gate wiring lines 15 or the source wiring lines 17. Further, it is not necessary to use a circularly polarizing plate. As a result, it is possible to provide an organic EL device at low cost without complicating the manufacturing process.

Second Embodiment

Next, a second embodiment of the invention will be described. Similarly to the first embodiment, in the following drawings, the scales of the elements are suitably changed so that the elements can be clearly recognized. In addition, the same elements as those of the first embodiment are represented by the same reference numerals and the descriptions thereof will be omitted. In the present embodiment, since the configuration of the half mirror is different from that of the first embodiment, the present embodiment will be described with laying emphasis on this difference.

Figure 9:
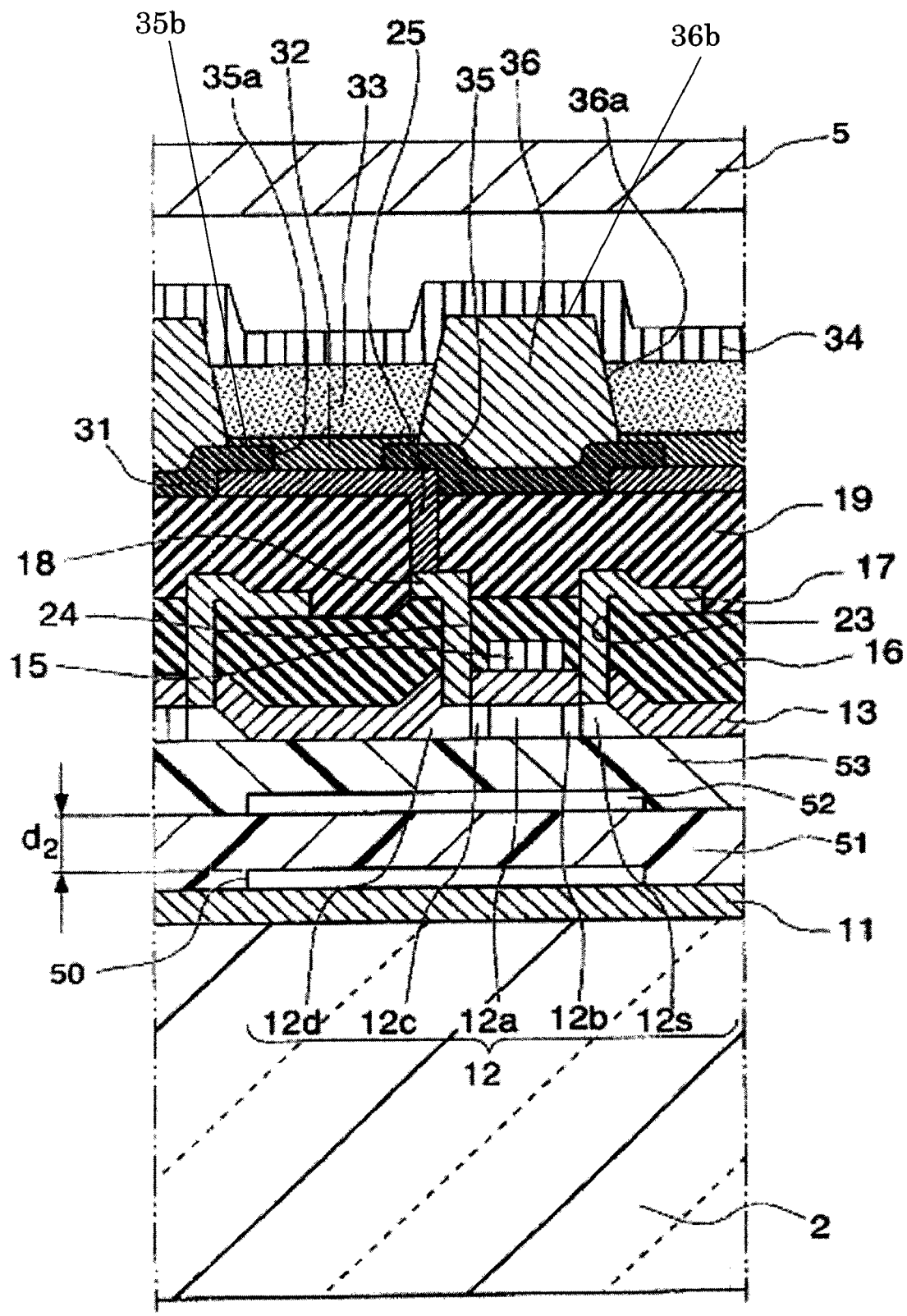
FIG. 9 is a cross-sectional view showing the overall configuration of an organic EL device according to a second embodiment of the invention.

FIG. 9 is a schematic diagram showing the cross-section of an organic EL device 200 according to the second embodiment of the invention.

The organic EL device 200 includes a base substrate 10 in which circuit elements or wiring lines and an insulating layer formed on a substrate 2, an organic EL element 3 formed on the base substrate 10, and an external circuit unit 4 attached to an end 2a (FIG. 2) of the base substrate 10. The organic EL element 3 emits light according to an electrical signal which is supplied from the external circuit unit 4, such that an image or a moving picture is displayed. In the present embodiment, the organic EL device is an active matrix type on which thin film transistors (TFTs) are formed and is a bottom emission type in which light generated by the organic EL element 3 is emitted with having transmitted the base substrate 10 is exemplified. Therefore, the second embodiment has the same configuration as that of the first embodiment, except that a half mirror 50, a first transparent layer 51, a reflecting layer 52 and a second transparent layer 53 are provided on a base protective layer 11 of the base substrate 10.

The half mirror 50 is made of a metal such as molybdenum in a shape of a film so as to cover all regions L between pixels. As a result, the half mirror 50 reflects some of light transmitted through the substrate 2 and the base protective layer 11 on the substrate 2 and transmits the remainder. In addition, similarly to the half mirror 50, the reflecting layer 52 is made of a metal such as molybdenum so as to overlap the half mirror 50 with the first transparent layer 51 interposed therebetween. The reflecting layer 52 is formed to have a sufficient thickness to substantially completely reflect light transmitted through the half mirror 50, that is, 50 nm.

The first transparent layer 51 is provided on the base protective layer 11 so as to cover the half mirror 50 and the second transparent layer 53 is provided on the first transparent layer 51 so as to cover the reflecting layer 52. The first and second transparent layers 51 and 53 are made of a transparent material such as, for example, $SiO_2$.

The half mirror 50 and the reflecting layer 52 may have the same shape. In addition, the half mirror 50 may be formed larger than the reflecting layer 52. In addition, when a wavelength of incident light from an exterior is $\lambda 1$, a refractive index of the first transparent layer 51 is n2, and m2 is an integer more than zero, it is preferable that the half mirror 50 be provided at the distance d2 represented by the following equation from the reflecting layer 52:

$$d2=\lambda 2(\tfrac{1}{2}+m2)/2n2$$

According to this configuration, similarly to the first embodiment, the light reflected by the half mirror 50 after being transmitted through the substrate 2 and light transmitted through the half mirror 50 again after being transmitted through the half mirror 50 as it is and being reflected by the reflecting layer 52 interfere to cancel out.

In addition, the second embodiment is the same as the first embodiment in that the first transparent layer 51 can be easily adjusted to have the thickness according to the distance d2 and the contrast can be effectively improved when λ1 is set to the central wavelength 520 nm of visible light, for example, 520 nm. In addition, the second embodiment is the same as the first embodiment in that, when the half mirror 50 is formed to have the film thickness (that is, reflectance and transmittance) such that the intensity of light reflected by the half mirror 50 and the intensity of light returned after being transmitted through the half mirror 50 twice are substantially equal to each other, light substantially completely interfere with each other to be attenuated.

In addition, in the process for forming the half mirror 50, after forming a molybdenum thin film on one surface of the actual display region P of the base protective layer 11, a portion of the pixel region K may be removed by a patterning process. Therefore, the half mirror 50 can be easily formed. In addition, the reflecting layer 52 can be formed by using the same manner.

According to the second embodiment having the above-mentioned configuration, since light transmitted through the half mirror 50 is reflected by the reflecting layer 52 which is additionally provided, not by the source wiring line 17 or the cathode 34, the reflecting layer 52 may be provided on any region without being restricted by the arrangement of the source wiring line 17 or the cathode 34. For example, the half mirror 50 and the reflecting layer 52 may be formed on all regions between pixels L as well as the region on which the source wiring line 17 is provided. As the material for forming the reflecting layer 52, a suitable material having the superior reflective characteristics be selected irregardless of the conductance.

(Electronic Apparatus)

Next, an electronic apparatus according to the invention will be described with a cellular phone as an example.

Figure 10:
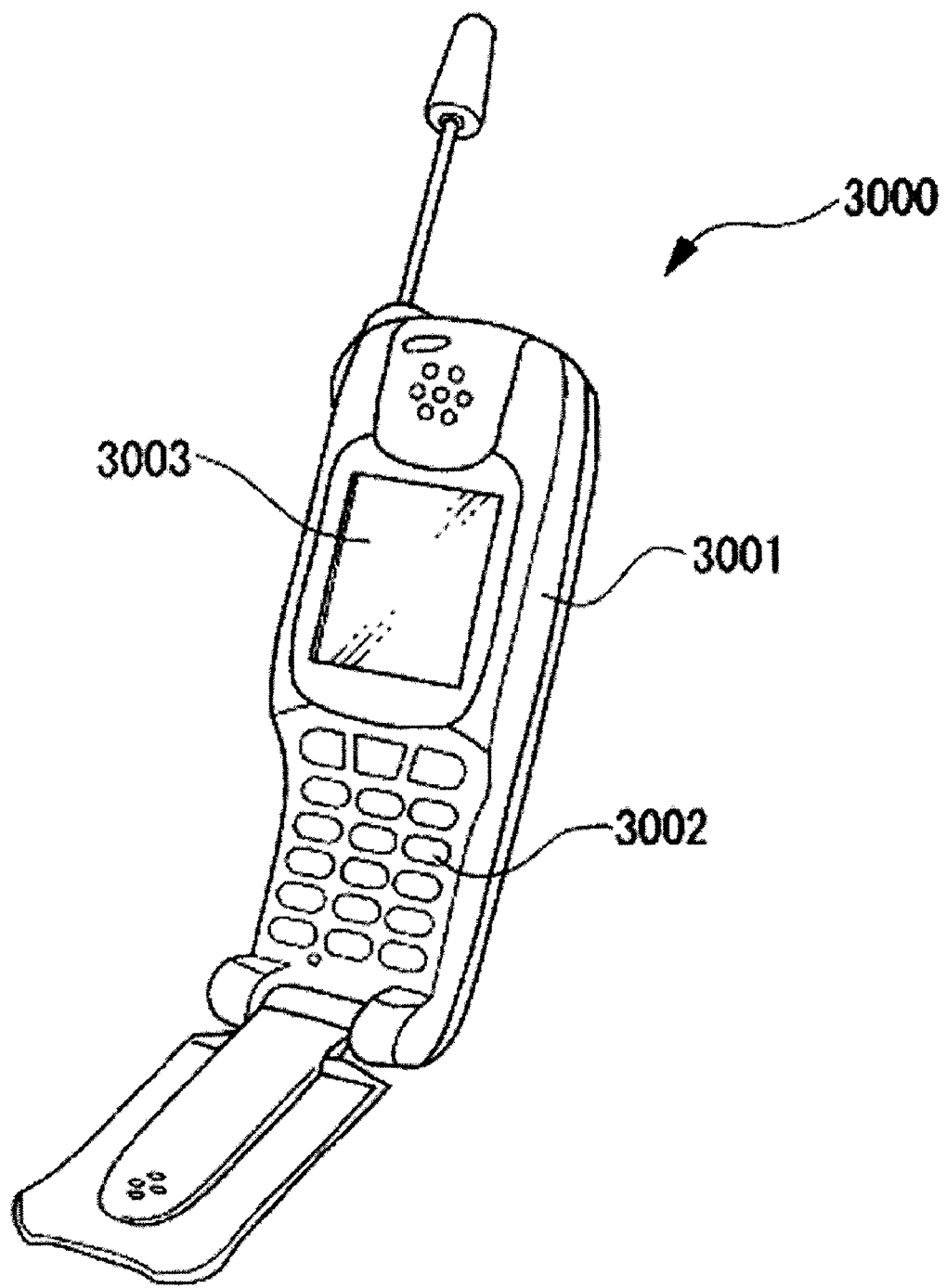
FIG. 10 is a perspective view showing a configuration of an electronic apparatus according to the invention.

FIG. 10 is a perspective view showing the overall configuration of a cellular phone 3000.

The cellular phone 3000 has a case 3001, an operating unit 3002 on which a plurality of operating buttons are provided, and a display unit 3003 for displaying an image or a moving picture, a character, and the like. The organic EL device 1 according to the invention is mounted on the display unit 3003.

According to the present embodiment, the organic EL device 1 which is capable of suppressing the reflection of external light is mounted on the display unit without complicating the manufacturing process. As a result, it is possible to obtain the electronic apparatus having the high contrast at low manufacturing cost.

In addition, the invention is not limited to the above-mentioned embodiments and various changes and modifications can be made within a scope without departing from the spirit of the invention. For example, according to the above-mentioned embodiments, the half mirror 14 is formed with respect to the gate wiring line 15 or the power supply line 102. However, a half mirror as a countermeasure against reflected light may be formed with respect to the gate wiring line 15 or the power supply line 102. As a result, since the reflection of light by the gate wiring line 15 or the power supply line 102 is suppressed, it is possible to further improve the contrast.

What is claimed is:

1. An organic EL device comprising:
   a transparent substrate;
   a gate line which extends in a first direction provided on the substrate;
   a source line which extends in a second direction crossing the gate line;
   transistors;
   pixel electrodes which are provided in correspondence with the transistors;
   for each pixel, a light-emitting layer which is provided on the pixel electrode;
   a bank layer which is provided between adjacent light-emitting layers; and
   a common electrode which is provided to cover the light-emitting layers and the bank layer from a side opposite to the substrate, wherein
   the transistor has a silicon film which has a channel region, a source region and a drain region and is formed on the substrate, a gate insulation film formed on the silicon film and the substrate, and a gate line which is formed on the gate insulation film,
   the gate line and the source line, which is formed on the gate insulation film, are electrically connected to the gate insulation film and the source region through the insulation film,
   light from the light-emitting layer is emitted by being transmitted through the substrate,
   the source line is provided between the transistors and the pixel electrodes, the bank layer is provided between the pixel electrodes and the common electrode, and the source line and the bank layer are positioned between adjacent pixels on the substrate in plan view,
   a first light transflective layer is provided between the source line and the gate insulation layer of the transistor formed on the substrate, at a predetermined distance from the source line,
   a second light transflective layer is provided inside the bank layer at a predetermined distance from the common electrode,
   the first and second light transflective layers are positioned between adjacent pixels on the substrate in plan view,
   the first light transflective layer is positioned so as to cause interference and canceling out between light that enters by being transmitted through the substrate and which is reflected by the first light transflective layer, and returning light that is reflected by the source line and is transmitted through the first light transflective layer again after being transmitted through the substrate and the first light transflective layer, and
   the second light transflective layer is positioned so as to cause interference and canceling out between light that enters by being transmitted through the substrate and which is reflected by the second light transflective layer, and returning light that is reflected by the common electrode and transmitted through the second light transflective layer again after being transmitted through the substrate and the second light transflective layer.

2. The organic EL device according to claim 1, wherein the first and second light transflective layers are provided so as to have substantially the same pattern as that of the source line.

3. The organic EL device according to claim 1, wherein the first light transflective layer is formed wider than the source line.

4. The organic EL device according to claim 1, wherein, when the predetermined distance is d1, a wavelength of incident light which enters through the substrate is λ1, a refractive index of a region between the source line and the first light transflective layer is n1, and m1 is an integer greater than or equal to zero, the first light transflective layer is provided such that the distance d1 is represented by the following equation (1):

$$d1 = \lambda 1 (\frac{1}{2} + m1)/2n1 \qquad (1).$$

5. The organic EL device according to claim 4, wherein the value of λ1 in the equation (1) is a value near a central wavelength of visible light.

6. The organic EL device according to claim 1, wherein a transmittance and a reflectance of the first light transflective layer are set such that the intensity of light reflected by the first light transflective layer and the intensity of light transmitted through the first light transflective layer again after being transmitted through the first light transflective layer and being reflected by the source line are substantially equal to each other.

7. The organic EL device according to claim 1, wherein the first and second light transflective layers are made of metal.

* * * * *